United States Patent [19]
Flassayer

[11] Patent Number: 6,034,765
[45] Date of Patent: Mar. 7, 2000

[54] CONTACTLESS POSITION AND DISPLACEMENT MEASURING DEVICE

[75] Inventor: Claude Flassayer, Saint Jeannet, France

[73] Assignee: Vishay SA, France

[21] Appl. No.: 09/057,880

[22] Filed: Apr. 9, 1998

[30] Foreign Application Priority Data

Sep. 5, 1997 [FR] France .................................. 97 05722

[51] Int. Cl.$^7$ ...................................................... G01J 1/90
[52] U.S. Cl. ............................................. 356/213; 356/375
[58] Field of Search ............................ 356/72, 375, 376, 356/399, 400, 401, 213; 338/15; 257/431, 435, 436, 458; 250/214.1, 214 LA

[56] References Cited

U.S. PATENT DOCUMENTS 4,961,096 10/1990 Idesawa ...................................... 357/68
5,541,652 7/1996 Jackson et al. .

OTHER PUBLICATIONS

Patent Abstracts of Japan, vol. 8, n° 139, Jun. 28, 1984, & JP 59 050579 (Komatsu Seisakusho K.K.) Mar. 23, 1984.
Patent Abstracts of Japan, vol. 12, n° 396, Oct. 21, 1988 & JP 63 137319 (Kyocera Corp), Jun. 9, 1988.
Patent Abstracts of Japan, vol. 11, n° 122, Apr. 16, 1987 & JP 61 269384 (Nissan Motor Co Ltd), Nov. 28, 1986.
Patent Abstracts of Japan, vol. 15, n° 179, May 8, 1991 & JP 03 042879 (Yamatake Honeywell Co Ltd), Feb. 25, 1991.

*Primary Examiner*—Frank G. Font
*Assistant Examiner*—Tu T. Nguyen
*Attorney, Agent, or Firm*—Bachman & LaPointe, P.C.

[57] ABSTRACT

A contactless position and displacement measuring device includes at least one light source and at least one photosensor adapted to move relative to each other. When illuminated by a light beam emitted by the light source the photosensor generates at least one electrical signal representative of the position of the light source relative to the photosensor. The sensor includes a plurality of layers deposited onto a support, namely at least one resistive first layer to form a potentiometer track, at least one photosensitive second layer to deliver electrical charges when it is illuminated by the light beam emitted by the source and at least one metallic third layer to collect the electrical charges generated by the photosensitive second layer.

10 Claims, 5 Drawing Sheets

CONTACTLESS POSITION AND DISPLACEMENT MEASURING DEVICE

BACKGROUND OF THE INVENTION

1. Field of the Invention

The present invention concerns a contactless position and displacement measuring device including at least one light source and at least one photosensor adapted to move relative to each other. When illuminated by a light beam emitted by the light source the photosensor generates at least one electrical signal representative of the position of the source relative to the photosensor.

2. Description of the Prior Art

In some prior art devices for measuring position and displacement the position of a mobile object is marked by a cursor that moves along a resistive or potentiometer track. A first drawback of this type of sensor is a result of their lack of precision because of the wear caused by the cursor rubbing on the resistive or potentiometer track which reduces the service life of the sensor. This makes these devices unsuited to applications in which the position of the mobile object must be defined with great precision. Furthermore, the service life of such devices is further limited if they operate in severe environments, in particular when there are high temperatures and high levels of vibration.

Other prior art devices include contactless position sensors known as continuous lateral effect sensors. Such sensors generally comprise a photosensitive cell including a PIN junction which when illuminated by a light spot generates an electrical charge proportional to the luminous intensity of said spot. The electrical charge generated moves across the P area of the PIN junction. Given that said P area has a uniform resistivity, the photocurrent collected by an end electrode is inversely proportional to the distance between the position of the light spot and the electrode concerned.

One drawback of this type of sensor is the result of the fact that the photosensitive cells are not perfectly linear, in particular because the surface resistance of the P area of the PIN junction is not homogeneous. Moreover, the electrical charge that moves across the P area depends on the temperature and on the luminous intensity as well as on the physical characteristics of the PIN junction.

The aim of the invention is to provide a contactless position and displacement measuring device adapted to deliver electrical signals independent of temperature, of variations in the luminous intensity delivered by the source and of the physical characteristics of the photosensitive cell used to generate said electrical signals.

Another aim of the invention is to provide a contactless position and displacement measuring device including a photosensor the dimensions and the shape of which can easily be adapted to detect and to measure the displacements of an object on a rectilinear trajectory or on a curvilinear trajectory.

SUMMARY OF THE INVENTION

The above aims are achieved by a contactless position and displacement measuring device including at least one light source and at least one photosensor adapted to move relative to each other, said photosensor being adapted, when illuminated by a light beam emitted by said light source, to generate at least one electrical signal representative of the position of said light source relative to said photosensor which includes a plurality of layers deposited onto a support, namely at least one resistive first layer adapted to form a potentiometer track, at least one photosensitive second layer adapted to deliver electrical charges when it is illuminated by said light beam emitted by said source and at least one metallic third layer adapted to collect said electrical charges generated by said photosensitive second layer.

The resulting stacked structure comprising the resistive first layer, the photosensitive second layer and the metallic third layer functions as a voltage generator that causes photocurrents to flow in said resistive track creating at the ends of the resistive track voltages depending on the position and the displacement of the light source relative to the photosensor.

An important advantage of this structure over the prior art devices results from the fact that the electrical signals delivered by the photosensor of the invention are practically independent of the physical characteristics of the photosensitive layer. Additionally, the potentiometer track consisting of the resistive first layer can be made independently of the photosensitive second layer. This means that its electrical and physical characteristics can be optimized to adapt the measuring device to different applications.

In accordance with one important feature of the invention the resistive first layer is totally or partly transparent and has a high resistivity.

In accordance with another feature of the invention the support onto which the resistive first layer, the photosensitive second layer and the metallic third layer are deposited can be a flexible material.

Accordingly, the measuring device of the invention can be used to determine the position and the displacement of the light source relative to the photosensor on curvilinear trajectories.

Other features and advantages of the invention will emerge from the following description given by way of non-limiting example with reference to the accompanying drawings.

DETAILED DESCRIPTION OF THE PREFERRED EMBODIMENTS

Figure 1:
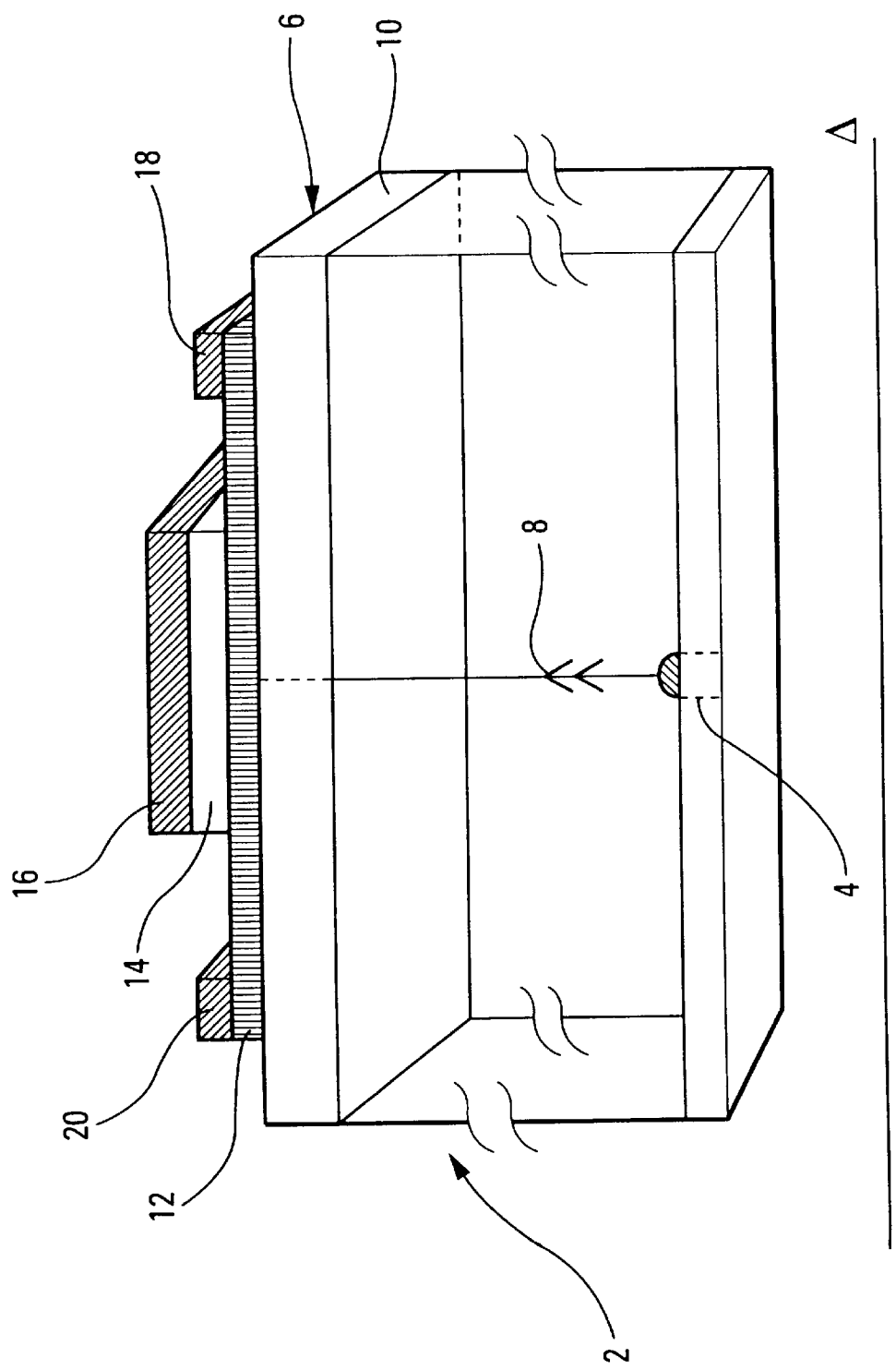
FIG. 1 is a schematic perspective view of a relative position and displacement measuring device in accordance with the invention.

FIG. 1 is a schematic representation of a contactless position and displacement measuring device 2 including at least one light source 4 and at least one photosensor 6. The light source 4 and the photosensor 6 can move relative to each other in the direction indicated by the axis Δ. When illuminated by the light beam 8 emitted by the light source 4, said photosensor 6 generates at least one electrical signal representative of the position of the light source 4 relative to the photosensor 6.

The position and displacement measuring device shown in FIG. 1 includes a linear photosensor including a plurality of layers deposited onto a support 10, namely at least one resistive first layer 12 adapted to form a potentiometer track, at least one photosensitive second layer 14 adapted to deliver electrical charges when illuminated by the light beam 8 emitted by the source 4 and at least one metallic third layer 16 adapted to collect said electrical charges generated by the photosensitive second layer 14.

The resistive first layer 12 preferably has a high resistivity and the photosensitive second layer 14 preferably includes a PIN junction constituting a photodiode. The photosensitive second layer 14 is made of amorphous silicon and includes a negatively doped first sub-layer 14a, an intrinsic (neutral) second sub-layer 14b and a positively doped third sub-layer 14c. Said resistive first layer 12 can be totally or partly transparent and includes a first terminal 18 and a second terminal 20 respectively adapted to collect a first electrical signal V1 and a second electrical signal V2 between said resistive first layer 12 and the metallic third layer 16.

Figure 2:
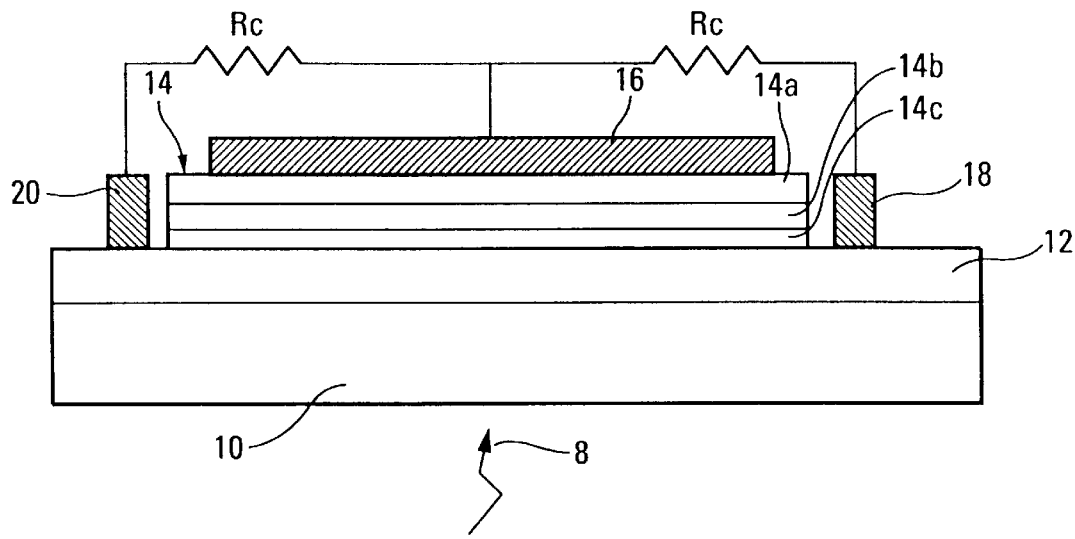
FIG. 2 is a partial front view of a photosensor equipping the device from FIG. 1 in a first embodiment of the invention.

FIG. 2 shows a first embodiment of the invention in which the support 10 is transparent, the resistive layer 12 is between the transparent support 10 and the photosensitive layer 14 and the metallic layer 16 is deposited on the photosensitive layer 14.

Figure 3:
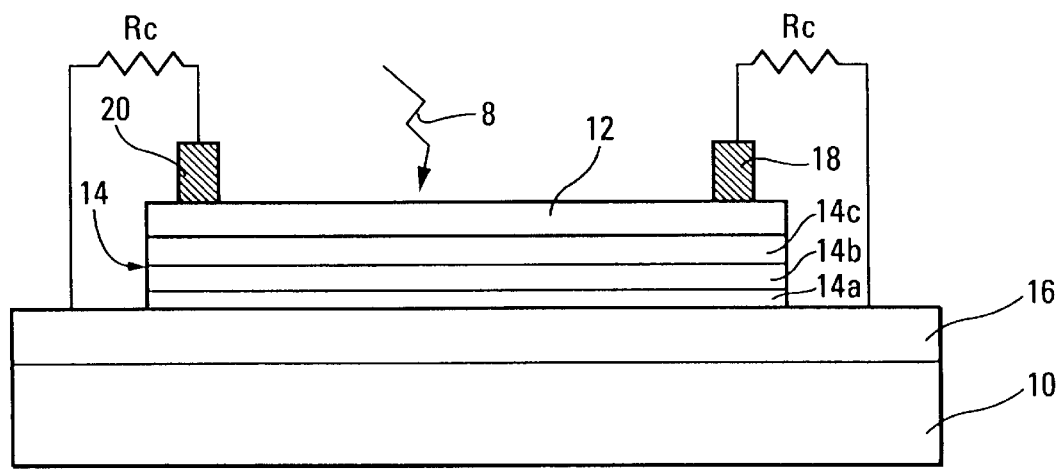
FIG. 3 is a partial front view of a photosensor equipping the device from FIG. 1 in a second embodiment of the invention.

FIG. 3 shows a second embodiment of the invention in which the support 10 is made of an opaque flexible material, the metallic layer 16 is between the transport support 10 and the photosensitive layer 14 and the resistive layer 12 is deposited on the photosensitive layer 14.

As can be seen in FIGS. 2 and 3 the position and displacement measuring device of the invention includes a first load resistor Rc connected to the first terminal 18 and to the metallic layer 16 and a second load resistor Rc connected to the second terminal 20 and to said metallic layer 16.

With the structures shown by FIGS. 2 and 3 the illuminated part of the PIN junction constitutes an optical cursor that electrically connects the metal layer 16 to a precise point on the potentiometer track coinciding with the point of impact of the light beam on the resistive track 12. Accordingly, there is no moving mechanical contact between the cursor and the potentiometer track and there is no electrical or mechanical contact between the light source and the photosensor.

Figure 4:
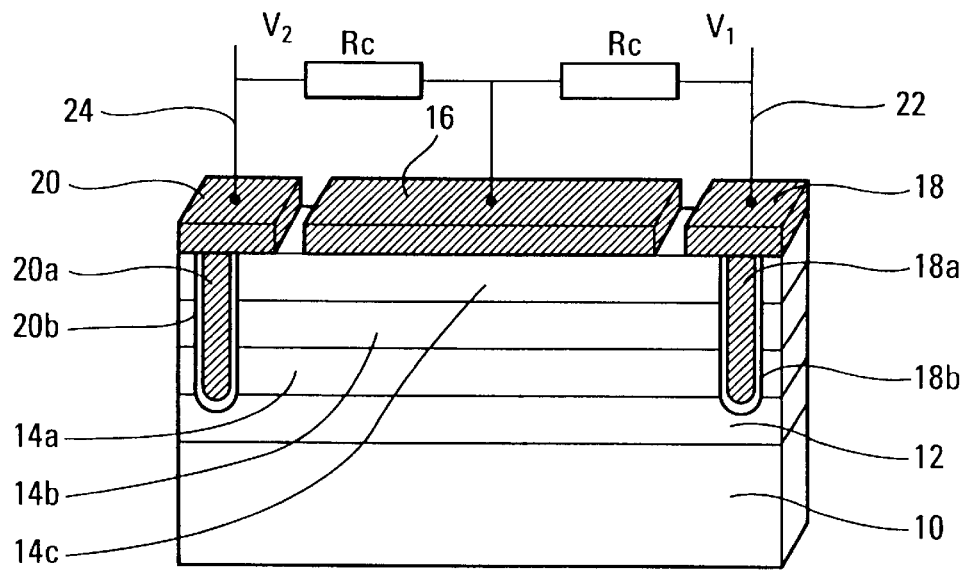
FIG. 4 is a schematic perspective view of a photosensor in the first embodiment of the invention.

As can be seen in FIG. 4, the terminals 18 and 20 are respectively extended by a conductive finger 18a and by a conductive finger 20a electrically insulated from the PIN junction by a first insulative area 18b and a second insulative area 20b, respectively. The conductive fingers 18a and 20a connect the transparent resistive layer 12 to a first external contact wire 22 and to a second external contact wire 24, respectively. The first and second contact wires 22 and 24 are respectively connected to the external load resistors Rc across which the electrical signals V1 and V2 generated by the photodiode 14 are collected.

The conductive fingers 18a and 20a and the insulative areas 18b and 20b can be made by laser cutting and vacuum deposition.

The resistive layer 12 is preferably made from tin oxide $SnO_2$ or indium tin oxide ITO. However, any homogenous transparent material having a high resistivity can be used for the potentiometer track 12 without departing from the scope of the invention.

Figure 5:
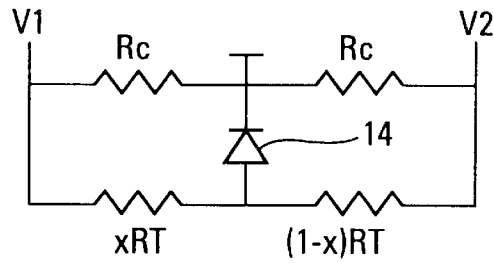
FIG. 5 represents an equivalent circuit diagram of the photosensor from FIG. 2.
Figure 6:
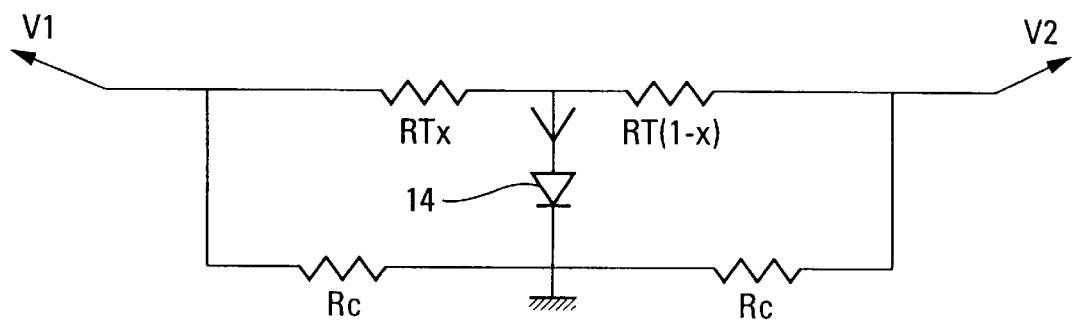
FIG. 6 represents an equivalent circuit diagram of the photosensor from FIG. 3.

FIGS. 5 and 6 respectively shown an equivalent circuit diagram of the photosensor 6 in the first embodiment of the invention and an equivalent circuit diagram of the photosensor 6 in the second embodiment of the invention. In both cases the potentiometer track 12 is represented by its total linear resistance RT and the photodiode 14 is equivalent to a voltage generator of electromotive force E feeding the two external resistors Rc. The potentiometer track 12 is divided into two areas on respective opposite sides of the point of impact x of the beam emitted by the light source 6 on the transparent layer 12, namely a first area having an electrical resistance xRT and a second area having an electrical resistance (1−x)RT.

In operation, the electrical voltages V1 and V2 delivered by the photodiode 14 at the terminal 18 and at the terminal 20, respectively, depend on the position x of the point of impact of the spot on the transparent layer 12 and are given by the following equations:

$$V1 = E \frac{Rc}{xRT + Rc}$$

$$V2 = E \frac{Rc}{(1-x)RT + Rc}$$

The ratio of these voltages is expressed by the equation:

$$\frac{V1}{V2} = \frac{Rc + xRT}{Rc + (1-x)RT}$$

The ratio depends on the values of the external resistors Rc, the value of the resistance RT of the potentiometer track and the position x of the light source 4 relative to the photosensor 6.

If a value of the load resistor Rc equal to a whole fraction of the value of the resistance RT is chosen, the ratio V1/V2 depends only on the position x.

If $Rc = \frac{RT}{k}$ where $k$ is an integer, for example, then $$\frac{V1}{V2} = \frac{1 + xk}{1 + (1-x)k}$$

If $k = 2$ then $$\frac{V1}{V2} = \frac{1 + 2x}{3 - 2x}$$

The ratio of the voltages V1 and V2 then depends only on the position x. A judicious choice of the resistivity of the potentiometer layer 12 and/or of the load resistors Rc linearizes this ratio.

Figure 7:
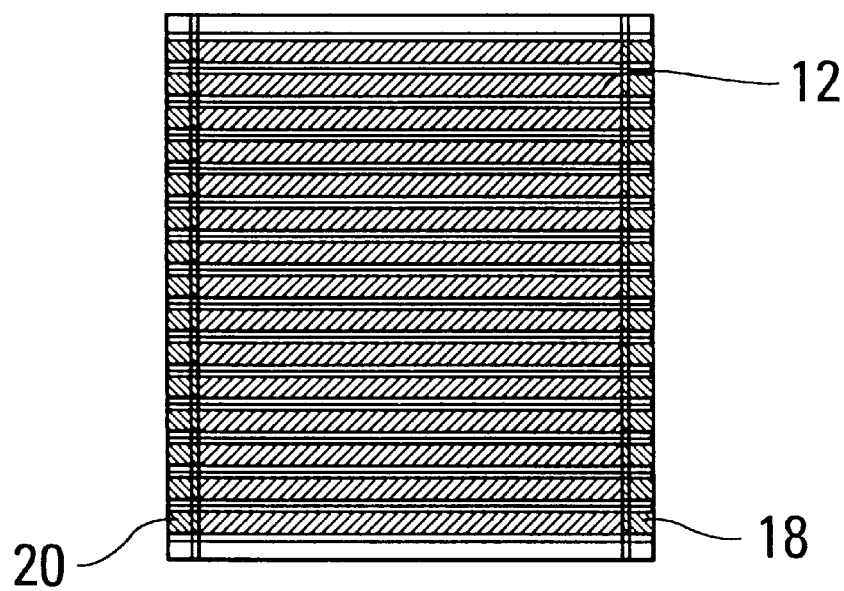
FIG. 7 is a schematic top view of a set of rectilinear photosensitive elements deposited on a substrate.

FIG. 7 is a schematic top view of a set of rectilinear photosensitive elements deposited on a substrate and adapted to be fitted to a linear position and displacement measuring device.

Figure 8:
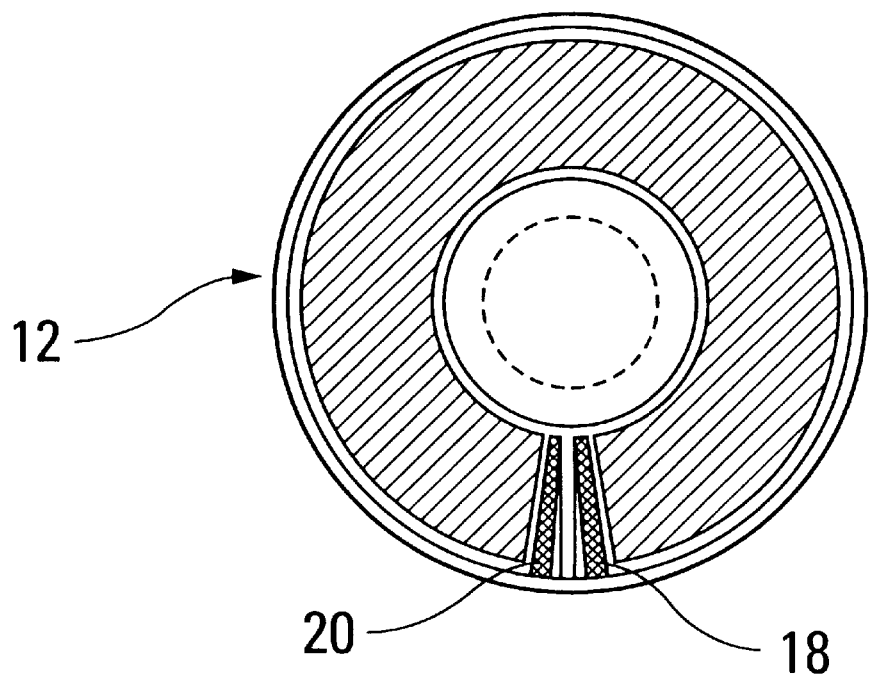
FIG. 8 is a schematic representation of a circular resistive track adapted to the fitted to a rotary photosensor of the invention.

FIG. 8 shows one embodiment of a resistive layer 12 adapted to be fitted to a rotary position and displacement measuring device.

Figure 9:
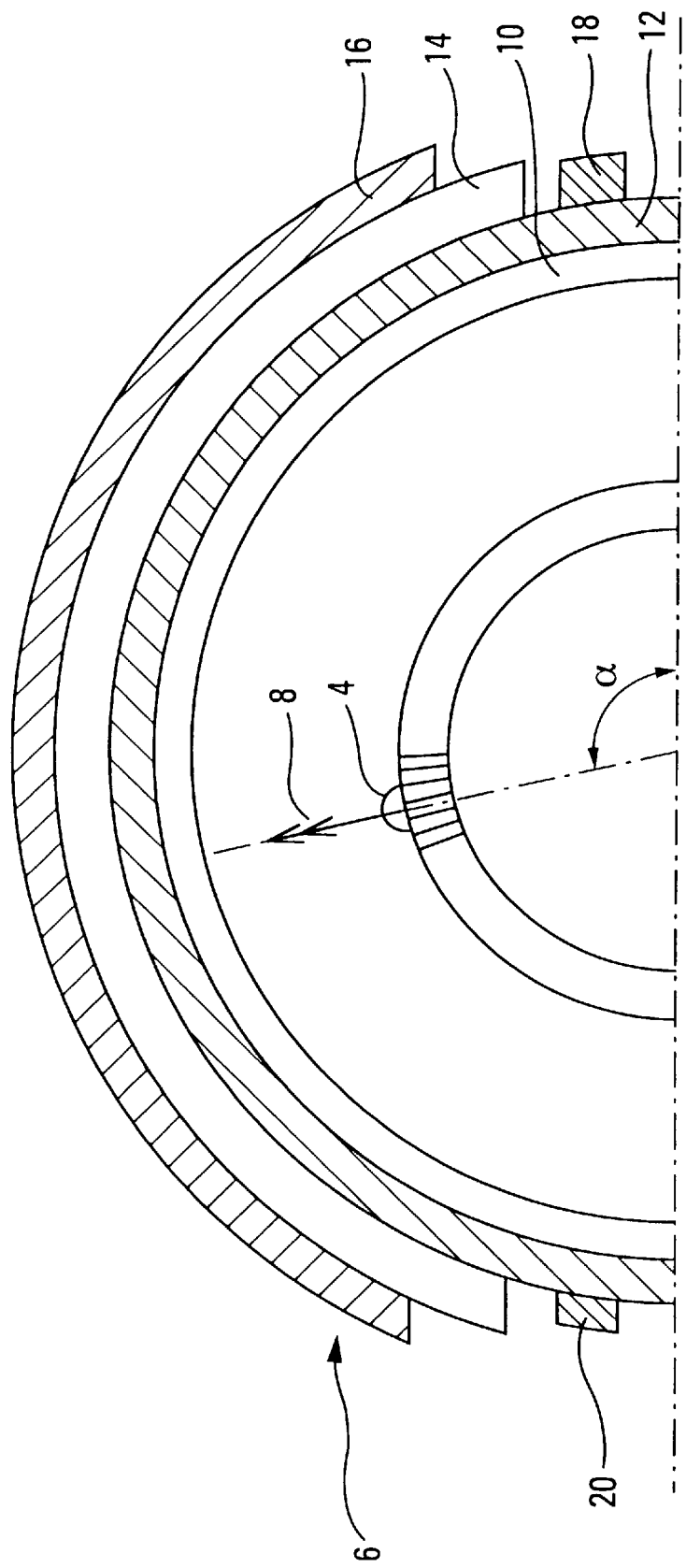
FIG. 9 is a schematic representation of a position and displacement measuring device of the invention equipped with a rotary photosensor provided with a transparent flexible support.

FIG. 9 is a schematic illustration of one embodiment of a device of this kind in which the transparent support 10 is made from a flexible material. This embodiment is suited to applications in which the light source 4 moves along a curvilinear path. In this case the signal delivered by the photosensor 6 represents an image of the angular position α of the light source 4 relative to the photosensor 6.

The set of stacked layers constituting the device of the invention can have other shapes and different lengths suited to specific uses without departing from the scope of the invention.

This is made possible by the use of flexible supports. Furthermore, said resistive layer 12 can easily be manufactured in large quantities with varied electrical and geometrical characteristics to offer greater flexibility of adaptation of the device of the invention to varied uses.

The light source 4 can be fixed to any object the position and the displacement of which relative to the photosensor 6 are to be measured. The invention applies equally to applications in which the light source 4 is fixed and the photosensor 6 moves relative to said light source 4.

There is claimed:

1. A contactless position and displacement measuring device including at least one light source and at least one photosensor adapted to move relative to each other, said at least one photosensor being adapted, when illuminated by a light beam emitted by said at least one light source, to generate at least one electrical signal representative of the position of said at least one light source relative to said at least one photosensor which includes a plurality of layers deposited onto a support, and said plurality of layers comprising at least one resistive first layer adapted to form a potentiometer track, at least one photosensitive second layer adapted to deliver electrical charges when illuminated by said light beam emitted by said at least one source and means for collecting said electrical charges generated by said photosensitive second layer; said collecting means comprising at least one metallic third layer adapted to collect said electrical charges generated by said photosensitive second layer.

2. The device claimed in claim 1 wherein said at least one resistive first layer is transparent and has a high resistivity.

3. The device claimed in claim 1 wherein said at least one photosensitive second layer includes a PIN junction deposited between said at least one resistive first layer and said at least one metallic third layer to constitute a photodiode.

4. The device claimed in claim 1 wherein said at least one resistive first layer includes a first terminal and a second terminal respectively adapted to collect a first electrical signal V1 and a second electrical signal V2 between said at least one resistive first layer and said at least on metallic third layer.

5. A device as claimed in claim 4 including a first resistor connected to said first terminal and to said at least one metallic third layer and a second resistor connected to said second terminal and to said at least one metallic third layer.

6. The device claimed in claim 1 wherein said support is made of a transparent material, said at least one resistive layer is between said transparent support and said at least one photosensitive layer and said at least one metallic layer is deposited on said at least one photosensitive layer.

7. The device claimed in claim 1 wherein said support is made of an opaque material, said at least one metallic layer is between said opaque support and said at least one photosensitive layer and said at least one resistive layer is deposited on said at least one photosensitive layer.

8. The device claimed in claim 7 wherein said support is made of a flexible material.

9. The device claimed in claim 1 wherein said at least one resistive layer is transparent and made of tin oxide $SnO_2$.

10. The device claimed in claim 1 wherein said at least one photosensitive second layer is made of amorphous silicon.

* * * * *